(12) United States Patent
Yang et al.

(10) Patent No.: US 12,389,729 B2
(45) Date of Patent: Aug. 12, 2025

(54) MICRO LIGHT EMITTING DEVICE STRUCTURE AND DISPLAY APPARATUS

(71) Applicant: PlayNitride Display Co., Ltd., Miaoli County (TW)

(72) Inventors: Shiang-Ning Yang, Miaoli County (TW); Yi-Min Su, Miaoli County (TW); Yu-Yun Lo, Miaoli County (TW); Bo-Wei Wu, Miaoli County (TW)

(73) Assignee: Play Nitride Display Co., Ltd., Miaoli County (TW)

( * ) Notice: Subject to any disclaimer, the term of this patent is extended or adjusted under 35 U.S.C. 154(b) by 363 days.

(21) Appl. No.: 17/364,913

(22) Filed: Jul. 1, 2021

(65) Prior Publication Data
US 2022/0320393 A1 Oct. 6, 2022

(30) Foreign Application Priority Data
Mar. 31, 2021 (TW) .................... 110111808

(51) Int. Cl.
*H10H 20/857* (2025.01)
*H10H 20/831* (2025.01)
*H10H 29/14* (2025.01)

(52) U.S. Cl.
CPC ...... *H10H 20/857* (2025.01); *H10H 20/8312* (2025.01); *H10H 29/142* (2025.01)

(58) Field of Classification Search
CPC ..... H01L 33/62; H01L 27/156; H01L 33/382; H01L 2933/0025; H01L 25/0753;
(Continued)

(56) References Cited

U.S. PATENT DOCUMENTS

| | | | |
|---|---|---|---|
| 5,593,917 A | * | 1/1997 | Nuyen ............... H01L 21/8252 438/464 |
| 6,881,599 B2 | | 4/2005 | Oohata |

(Continued)

FOREIGN PATENT DOCUMENTS

| | | |
|---|---|---|
| CN | 108550667 A | 9/2018 |
| CN | 112397491 A | 2/2021 |

(Continued)

OTHER PUBLICATIONS

MatWeb and Google result including "Sixth International Symposium on Precision Engineering Measurements and Instrumentation" (Year: 2010), compiled into one PDF titled "Young_Modulus_of_Materials_17364913".*

(Continued)

*Primary Examiner* — Julio J Maldonado
*Assistant Examiner* — Nathan Pridemore
(74) *Attorney, Agent, or Firm* — CKC & Partners Co., LLC

(57) ABSTRACT

A micro light emitting device structure includes a substrate, a connecting layer, a micro light emitting device and a covering layer. The connecting layer is connected to the substrate. The micro light emitting device is removably connected to the connecting layer, and includes a semiconductor epitaxial structure and two electrodes. The semiconductor epitaxial structure has an outer surface. The electrodes are disposed on a first surface of the outer surface of the semiconductor epitaxial structure, or disposed on the first surface of the outer surface of the semiconductor epitaxial structure and a second surface of the semiconductor epitaxial structure away from the first surface, respectively. The covering layer is disposed on the outer surface of the semiconductor epitaxial structure.

20 Claims, 12 Drawing Sheets

(58) Field of Classification Search
CPC .. H01L 33/44; H10H 20/857; H10H 20/8312; H10H 29/142; H10H 20/84; H10H 20/81; H10H 20/8506; H10H 20/852
See application file for complete search history.

(56) References Cited

U.S. PATENT DOCUMENTS

| | | | | |
|---|---|---|---|---|
| 2005/0051785 | A1* | 3/2005 | Erchak | H01L 23/48 |
| | | | | 257/E33.068 |
| 2014/0227813 | A1* | 8/2014 | Yoneda | H01L 33/62 |
| | | | | 438/33 |
| 2015/0179888 | A1* | 6/2015 | Wu | H10H 20/8312 |
| | | | | 257/79 |
| 2018/0323178 | A1* | 11/2018 | Meitl | H01L 33/62 |
| 2018/0342492 | A1* | 11/2018 | Lu | H01L 33/483 |
| 2018/0342691 | A1* | 11/2018 | Lu | H01L 33/0095 |
| 2019/0326143 | A1* | 10/2019 | Lai | H01L 24/95 |
| 2021/0028337 | A1* | 1/2021 | Yan | H10H 20/857 |

FOREIGN PATENT DOCUMENTS

| | | | | | |
|---|---|---|---|---|---|
| EP | | 2589642 | A1 * | 5/2013 | ........... C09D 183/04 |
| TW | | 201916342 | A | 4/2019 | |
| WO | WO-2016002584 | | A1 * | 1/2016 | ............... B32B 7/02 |

OTHER PUBLICATIONS

MatWeb and Google result including "Sixth International Symposium on Precision Engineering Measurements and Instrumentation", compiled into one PDF titled "Young_Modulus_of_Materials_17364913". (Year: 2010).*

* cited by examiner

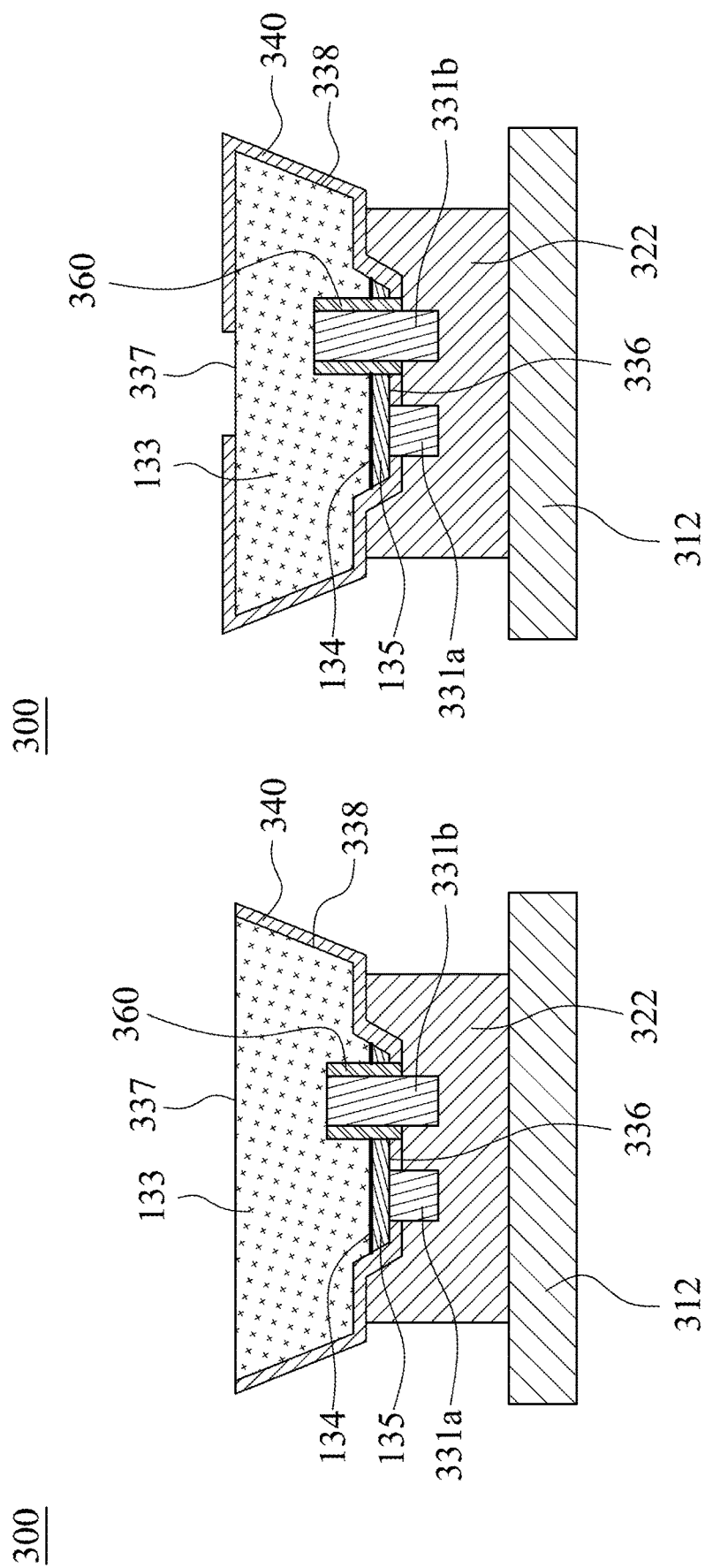

ized on the upper surface of each of the micro light emitting devices before removing a connecting

MICRO LIGHT EMITTING DEVICE STRUCTURE AND DISPLAY APPARATUS

RELATED APPLICATIONS

This application claims priority to Taiwan Application Serial Number 110111808, filed Mar. 31, 2021, which is herein incorporated by reference.

BACKGROUND

Technical Field

The present disclosure relates to a micro light emitting device structure and a display apparatus. More particularly, the present disclosure relates to a micro light emitting device structure and a display apparatus, which can be configured to enhance the yield rate and improve the process.

Description of Related Art

In the conventional art, when micro light emitting devices are disposed on a substrate, a covering layer (such as silicon oxide, $SiO_2$) is sputtered on an upper surface of each of the micro light emitting devices before removing a connecting layer (such as adhesive layer) between the micro light emitting devices, and the connecting layer between the micro light emitting devices are then removed. However, the aforementioned process is limited to the spacing between the micro light emitting device and the characteristic of the connecting layer, and the connecting layer between the micro light emitting devices is easily remained.

Hence, a micro light emitting device structure and a display apparatus, which are not limited to the spacing between micro light emitting devices and the characteristic of a connecting layer, need to be developed.

SUMMARY

According to one aspect of the present disclosure, a micro light emitting device structure includes a substrate, a connecting layer, a micro light emitting device and a covering layer. The connecting layer is connected to the substrate. The micro light emitting device is removably connected to the connecting layer, and includes a semiconductor epitaxial structure and two electrodes. The semiconductor epitaxial structure has an outer surface. The electrodes are disposed on a first surface of the outer surface of the semiconductor epitaxial structure, or disposed on the first surface of the outer surface of the semiconductor epitaxial structure and a second surface of the semiconductor epitaxial structure away from the first surface, respectively. The covering layer is disposed on the outer surface of the semiconductor epitaxial structure.

According to another aspect of the present disclosure, a display apparatus includes a circuit substrate, a plurality of micro light emitting devices, a covering layer and an isolation layer. The circuit substrate includes a pad layer. The micro light emitting devices are electrically connected to the circuit substrate via the pad layer, and each of the micro light emitting devices includes a semiconductor epitaxial structure and two electrodes. The semiconductor epitaxial structure has an outer surface. The electrodes are disposed on the semiconductor epitaxial structure, and electrically connected to the pad layer. The covering layer is disposed on the outer surface of the semiconductor epitaxial structure. The isolation layer is disposed on the outer surface of the semiconductor epitaxial structure, and the covering layer is contacted with the isolation layer.

BRIEF DESCRIPTION OF THE DRAWINGS

FIG. 10 is a schematic view of the micro light emitting device structure after transferring according to the embodiment in FIG. 7.

FIG. 11 is another schematic view of the micro light emitting device structure after transferring according to the embodiment in FIG. 7.

DETAILED DESCRIPTION

Figure 1:
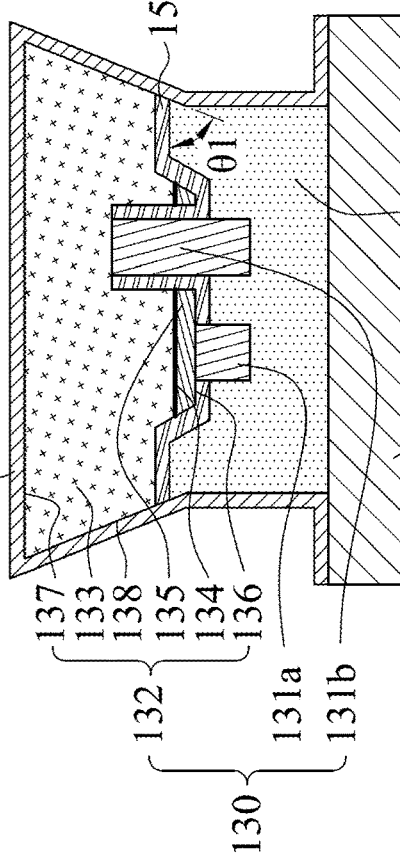
FIG. 1 is a schematic view of a micro light emitting device structure according to an embodiment of the present disclosure.

FIG. 1 is a schematic view of a micro light emitting device structure 100 according to an embodiment of the present disclosure. In FIG. 1, the micro light emitting device structure 100 includes a substrate 111, a connecting layer 121, a micro light emitting device 130 and a covering layer 140.

The connecting layer 121 is connected to the substrate 111, wherein the substrate 111 can be a temporary substrate (that is, a non-circuit substrate, which is configured to temporarily carry the micro light emitting devices for the mass transfer), and the substrate 111 can be a sapphire substrate or a glass substrate, which are the non-circuit substrates with high flatness, but the present disclosure is not limited thereto.

The micro light emitting device 130 is removably connected to the connecting layer 121, and includes a semiconductor epitaxial structure 132 and two electrodes, wherein the semiconductor epitaxial structure 132 has an outer surface, and includes a first semiconductor layer 133, a light emitting layer 134 and a second semiconductor layer 135. Furthermore, the light emitting layer 134 is disposed between the first semiconductor layer 133 and the second semiconductor layer 135, and the electrodes are disposed a first surface 136 of the outer surface of the semiconductor epitaxial structure 132, wherein the electrodes includes a first electrode 131a and a second electrode 131b, which have the opposite electrical properties, the first electrode 131a is electrically connected to the second semiconductor layer 135, and the second electrode 131b is electrically connected to the first semiconductor layer 133.

The covering layer 140 is disposed on the outer surface of the semiconductor epitaxial structure 132 and an outer surface of the connecting layer 121. In detail, the covering layer 140 is disposed on a second surface 137 and a lateral surface 138 of the semiconductor epitaxial structure 132, wherein the second surface 137 is relative to the first surface 136 of the semiconductor epitaxial structure 132. In particular, according to the embodiment of FIG. 1, the micro light emitting device 130 is a flip-chip micro LED.

Figure 2:
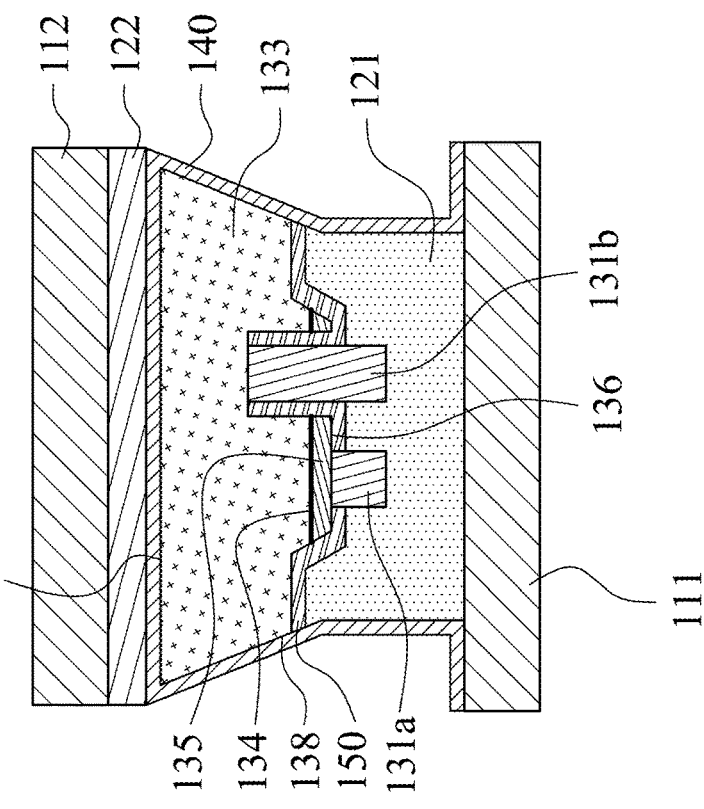
FIG. 2 is a transferring schematic view of the micro light emitting device structure according to the embodiment in FIG. 1.

By the aforementioned disposition of the micro light emitting device structure 100, when the transferring process is performed, the micro light emitting device 130 is temporarily fixed on the substrate 111 via the connecting layer 121. The micro light emitting device 130 can be smoothly removed from the substrate 111, and the micro light emitting device 130 is transferred to a transferring substrate 112 (as shown in FIG. 2) to proceed the following process. By the disposition of the covering layer 140, the micro light emitting device structure 100 can be effectively protected during the transferring process to promote the yield rate.

Moreover, a Young's modulus of the covering layer 140 is larger than a Young's modulus of the connecting layer 121, wherein the Young's modulus of the covering layer 140 is larger than or equal to 15 times of the Young's modulus of the connecting layer 121. When the Young's modulus of the covering layer 140 is less than 15 times of the Young's modulus of the connecting layer 121, the covering layer 140 or the connecting layer 121 may be easily remained on the micro light emitting device 130. Further, the difference of the Young's modulus is favorable for separating the micro light emitting device 130 from the connecting layer 121.

The micro light emitting device structure 100 further includes an isolation layer 150, wherein the isolation layer 150 is disposed on the first surface 136, and the covering layer 140 is contacted with a lateral surface of the isolation layer 150. The isolation layer 150 is merely disposed on the first surface 136, and hence the space of the lateral surface is not occupied to obtain the higher space utilization during the process.

A material of the covering layer 140 can be the same as or different from a material of the isolation layer 150, wherein the Young's modulus of the covering layer 140 is less than or equal to a Young's modulus of the isolation layer 150, a thickness of the covering layer 140 is less than or equal to a thickness of the isolation layer 150, and a hardness of the covering layer 140 is less than or equal to a hardness of the isolation layer 150. Because the Young's modulus of the covering layer 140 is less than or equal to the Young's modulus of the isolation layer 150, the transferring efficiency can be promoted, and the covering layer 140 can be avoided remaining on the micro light emitting device 130. Moreover, when at least one of the hardness, the thickness and the Young's modulus of the covering layer 140 is less than the hardness, the thickness and the Young's modulus of the isolation layer 150, the better transferring efficiency can be obtained. It should be mentioned that both of the isolation layer 150 and the covering layer 140 can be made of an inorganic material, such as isolation materials, which can be silicon dioxide or aluminum nitride, and the connecting layer 121 can be an organic material to more easily separate from the micro light emitting device 130 during the following process.

Furthermore, an angle θ1 is between the covering layer 140 and the isolation layer 150, wherein the angle θ1 can be less than or equal to 90 degrees. Therefore, the connecting layer 121 is more hardly remained during transferring the micro light emitting device structure 100. Furthermore, when the angle θ1 is less than or equal to 50 degrees, the micro light emitting device structure 100 can have the better transferring and separating point during transferring under pressing by a transferring device (not shown). Moreover, a cross-sectional view of the covering layer 140 and the isolation layer 150 is trapezoid, convex or inverted trapezoid, but the present disclosure is not limited thereto.

Figure 3:
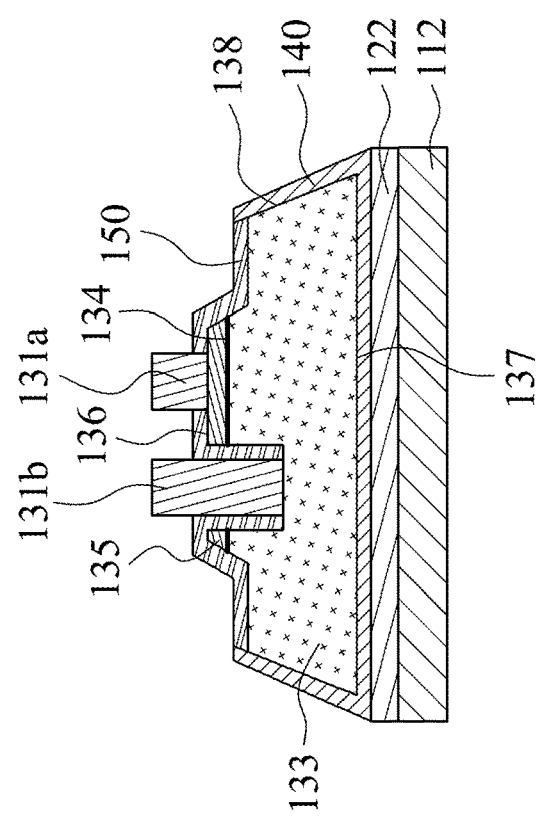
FIG. 3 is a breaking schematic view of the micro light emitting device structure according to the embodiment in FIG. 2.

FIG. 2 is a transferring schematic view of the micro light emitting device structure 100 according to the embodiment in FIG. 1. FIG. 3 is a breaking schematic view of the micro light emitting device structure 100 according to the embodiment in FIG. 2. In FIGS. 2 and 3, when the micro light emitting device structure 100 is transferred, the transferring substrate 112 is disposed on the micro light emitting device 130 and the covering layer 140, wherein a transferring material 122 is contacted with the covering layer 140 on the second surface 137 of the semiconductor epitaxial structure 132, and the transferring material 122 is disposed between the transferring substrate 112 and the covering layer 140 to connect the transferring substrate 112 and the micro light emitting device 130 of the micro light emitting device structure 100. Further, the micro light emitting device structure 100 is pressed via the transferring substrate 112, the connecting layer 121 is squeezed and deformed, and the connecting layer 121 is broken along a breaking line B, wherein the connecting layer 121 can be broken from a breaking beginning point P, but the present disclosure is not limited thereto. It should be mentioned that a material of the transferring substrate 112 and the material of the substrate 111 can be the same to avoid the transferring displacement of the micro light emitting device 130 because of the difference of the pressure and the temperature, and a material of the transferring material 122 and the material of the connecting layer 121 can be the same to be favorable for the micro light emitting device structure 100 to be further transferred to another substrate, but the present disclosure is not limited thereto.

Moreover, both of the Young's modulus of the covering layer 140 and the Young's modulus of the isolation layer 150 are larger than the Young's modulus of the connecting layer 121 and a Young's modulus of the transferring material 122.

By the difference of the Young's modulus, the connecting layer 121 is hardly remained on a surface of the isolation layer 150.

Figure 4:
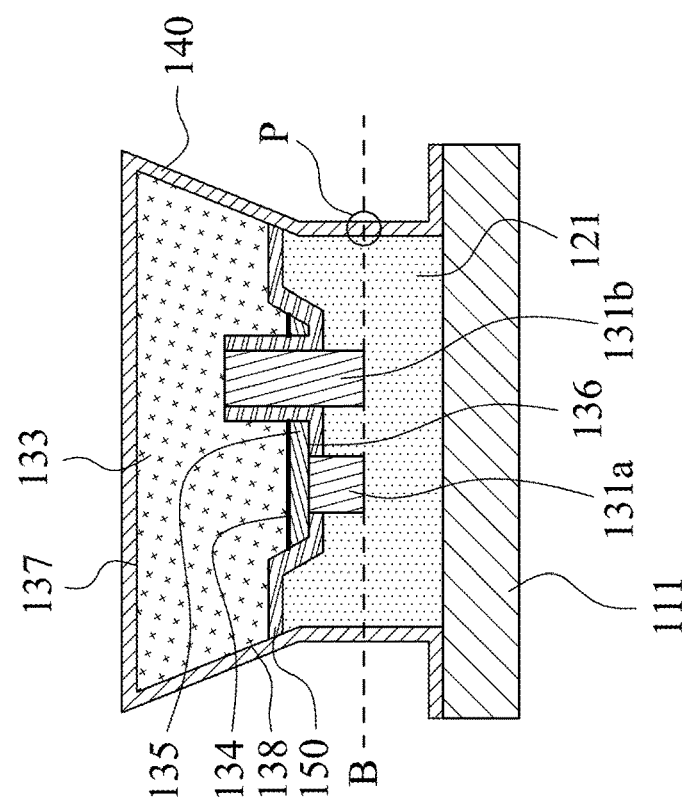
FIG. 4 is a schematic view of the micro light emitting device structure after transferring according to the embodiment in FIG. 1.

FIG. 4 is a schematic view of the micro light emitting device structure 100 after transferring according to the embodiment in FIG. 1. In FIG. 4, after transferring the micro light emitting device structure 100, the connecting layer 121 is separated from a surface of the isolation layer 150 and surfaces of the electrodes (that is, the first electrode 131a and the second electrode 131b), and a residual side (not shown) of the covering layer 140 may be formed on an edge of the first surface 136 of the semiconductor epitaxial structure 132. Hence, the micro light emitting device structure 100 according to the embodiment of FIG. 4 can be obtained by purging the residual side of the covering layer 140 after transferring to avoid the residual side of the covering layer 140 influencing the following assembling process. Further, according to the embodiment of FIG. 4, the covering layer 140 is merely disposed on the lateral surface of the isolation layer 150, and the isolation layer 150 is further disposed on a portion of the lateral surface 138 of the outer surface of the semiconductor epitaxial structure 132.

Figure 5:
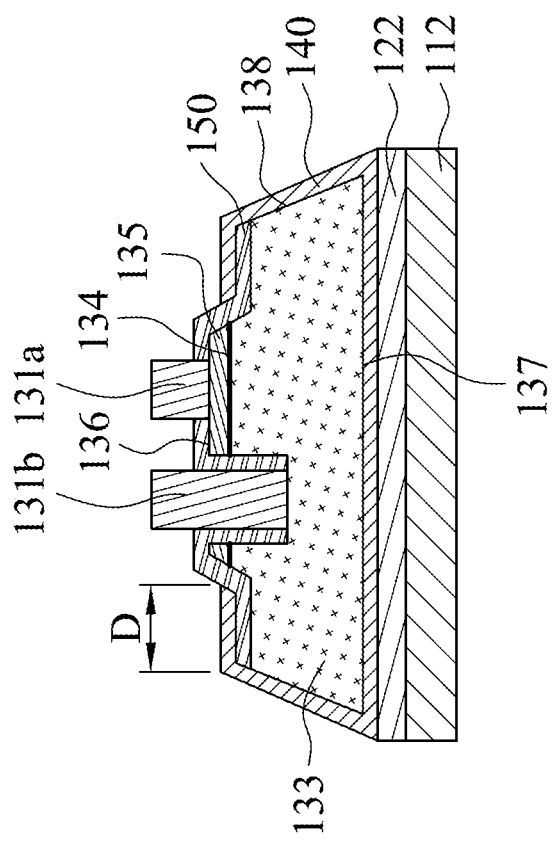
FIG. 5 is another schematic view of the micro light emitting device structure after transferring according to the embodiment in FIG. 1.

FIG. 5 is another schematic view of the micro light emitting device structure 100 after transferring according to the embodiment in FIG. 1. In FIG. 5, the covering layer 140 can be further disposed on the isolation layer 150, and the isolation layer 150 is further disposed on the portion of the lateral surface 138 of the outer surface of the semiconductor epitaxial structure 132, wherein a disposing distance D of the covering layer 140 is less than or equal to 10 μm. In detail, the disposing distance D of the covering layer 140 is about 3 μm to 4 μm, wherein the covering layer 140 covers a portion of the isolation layer 150, and both of the isolation layer 150 and the covering layer 140 cover a lateral surface of the light emitting layer 134. Therefore, the light emitting layer 134 can be entirely protected by the dual protection of the isolation layer 150 and the covering layer 140. In particular, if the disposing distance D is larger than 10 μm, that is, the covering layer 140 is too close to a center of the micro light emitting device 130, the connecting layer 121 is hardly broken along the breaking line B (shown as FIG. 3) during the transferring process, and the connecting layer 121 is easily remained on the surface of the isolation layer 150.

In detail, when the covering layer 140 and the isolation layer 150 are disposed on a light emitting surface of the micro light emitting device 130, the covering layer 140 and the isolation layer 150 are configured to guide the light; when the covering layer 140 and the isolation layer 150 are disposed on the lateral surface 138 of the semiconductor epitaxial structure 132, the covering layer 140 and the isolation layer 150 are configured to isolate and protect.

Figure 6:
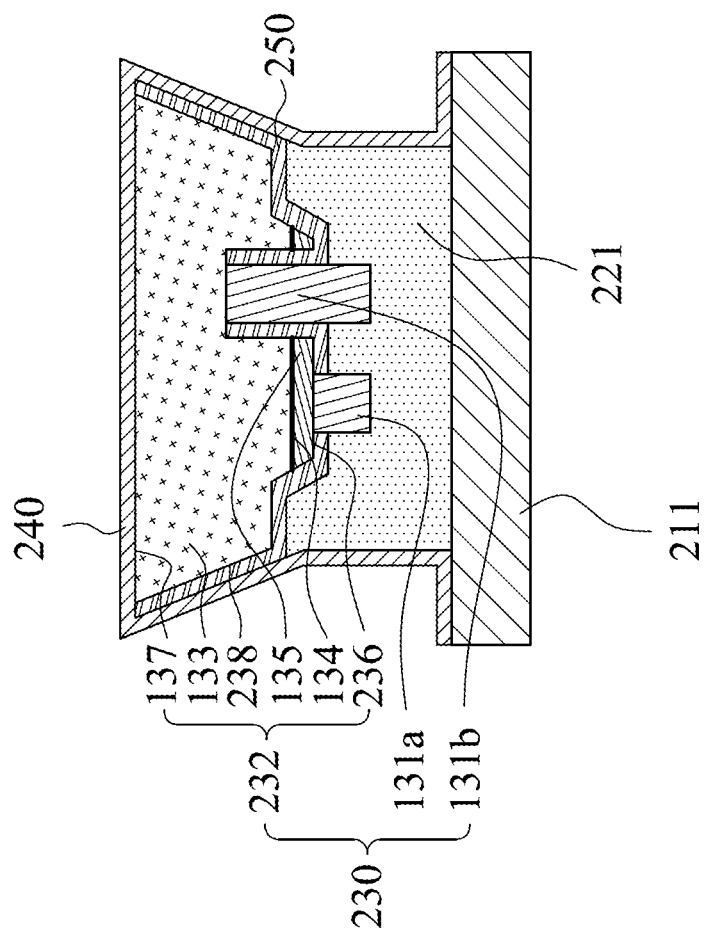
FIG. 6 is a schematic view of a micro light emitting device structure according to another embodiment of the present disclosure.

FIG. 6 is a schematic view of a micro light emitting device structure 200 according to another embodiment of the present disclosure. In FIG. 6, the micro light emitting device structure 200 includes a substrate 211, a connecting layer 221, a micro light emitting device 230, a covering layer 240 and an isolation layer 250.

The micro light emitting device 230 is removably connected to the connecting layer 221, and the covering layer 240 is disposed on an outer surface of a semiconductor epitaxial structure 232 and an outer surface of the connecting layer 221. The isolation layer 250 is disposed on a first surface 236 and a lateral surface 238 of the semiconductor epitaxial structure 232, and the isolation layer 250 disposed on the lateral surface 238 of the semiconductor epitaxial structure 232 entirely overlaps the covering layer 240 disposed on the lateral surface 238 of the semiconductor epitaxial structure 232. In particular, the covering layer 240 is disposed on the outermost, and the isolation layer 250 is disposed between the covering layer 240 and the semiconductor epitaxial structure 232. Therefore, the lateral surface 238 of the semiconductor epitaxial structure 232 can be entirely protected by the dual protection of the isolation layer 250 and the covering layer 240.

Further, all of other structures and dispositions according to the embodiment of FIG. 6 are the same as the structures and the dispositions according to the embodiment of FIG. 1, and will not be described again herein.

Figure 7:
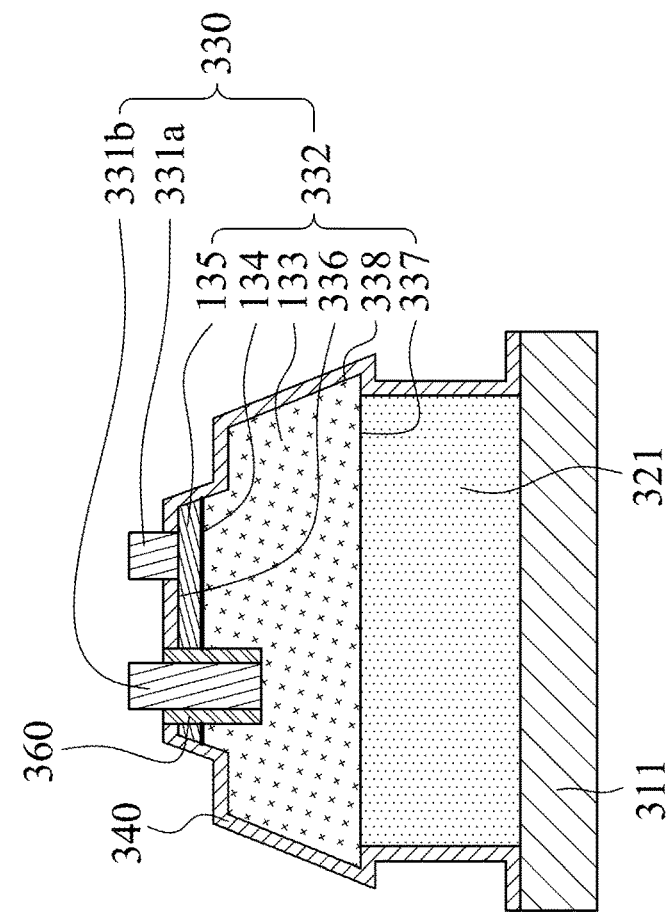
FIG. 7 is an assembling schematic view of a substrate, a connecting layer, a semiconductor epitaxial structure and a covering layer according to an embodiment of the present disclosure.
Figure 8:
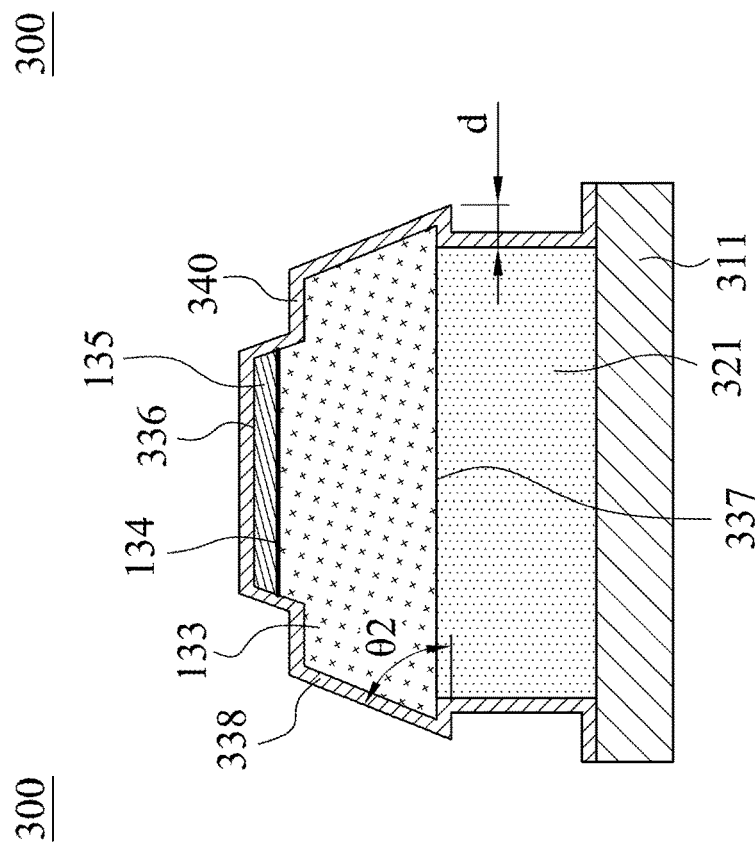
FIG. 8 is a schematic view of disposing electrodes of a micro light emitting device structure according to the embodiment in FIG. 7.

FIG. 7 is an assembling schematic view of a substrate 311, a connecting layer 321, a semiconductor epitaxial structure 332 and a covering layer 340 according to an embodiment of the present disclosure. FIG. 8 is a schematic view of disposing electrodes of a micro light emitting device structure 300 according to the embodiment in FIG. 7. In FIGS. 7 and 8, the micro light emitting device structure 300 includes the substrate 311, the connecting layer 321, a micro light emitting device 330 and the covering layer 340.

The micro light emitting device 330 is removably connected to the connecting layer 321, and the covering layer 340 is disposed on an outer surface of the semiconductor epitaxial structure 332 and an outer surface of the connecting layer 321. In detail, the covering layer 340 is disposed on a first surface 336 and a lateral surface 338 of the semiconductor epitaxial structure 332. Therefore, the micro light emitting device structure 300 can be effectively protected during the transferring process. Furthermore, the covering layer 340 can be disposed on the outer surface of the semiconductor epitaxial structure 332 and the outer surface of the connecting layer 321, a portion of the covering layer 340 is then removed to form openings, an insulating layer 360 is disposed on inner walls of the openings, and electrodes (that is, a first electrode 331a and a second electrode 331b) are disposed on the semiconductor epitaxial structure 332, but the present disclosure is not limited thereto.

Figure 9:
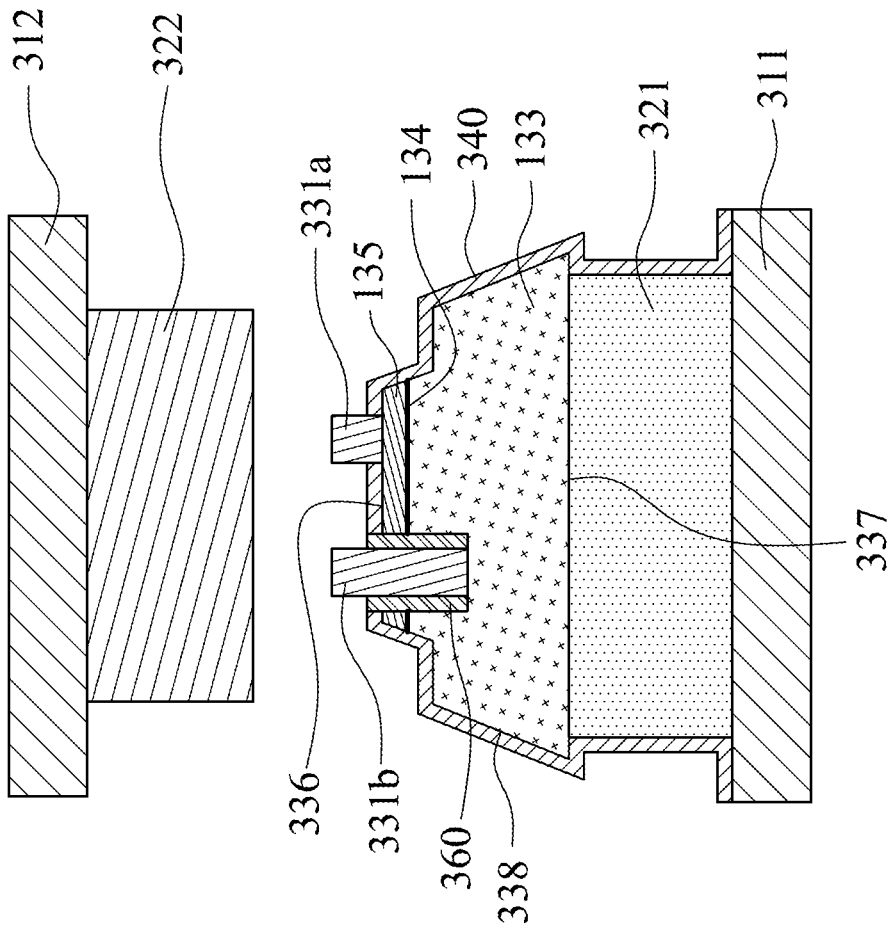
FIG. 9 is a transferring schematic view of the micro light emitting device structure according to the embodiment in FIG. 7.

FIG. 9 is a transferring schematic view of the micro light emitting device structure 300 according to the embodiment in FIG. 7. In FIG. 9, when the micro light emitting device structure 300 is transferred, a transferring substrate 312 is disposed on the micro light emitting device 330, wherein a transferring material 322 is contacted with the covering layer 340 on the first surface 336 of the semiconductor epitaxial structure 332, and the transferring material 322 is disposed between the transferring substrate 312 and the covering layer 340 to connect the transferring substrate 312 and the micro light emitting device 330 of the micro light emitting device structure 300. Further, the micro light emitting device structure 300 is pressed via the transferring substrate 312, and the covering layer 340 and the connecting layer 321 are squeezed and deformed.

Moreover, both of a Young's modulus of the covering layer 340 and a Young's modulus of the semiconductor epitaxial structure 332 are larger than a Young's modulus of the connecting layer 321, wherein the Young's modulus of the semiconductor epitaxial structure 332 is larger than 15 times of the Young's modulus of the connecting layer 321 and the Young's modulus of the transferring material 322, but the present disclosure is not limited thereto. The difference of the Young's modulus is favorable for separating the micro light emitting device 330 from the connecting layer 321, and the connecting layer 321 is hardly remained on a second surface 337 of the semiconductor epitaxial structure 332, wherein the second surface 337 is away from the first surface 336 of the semiconductor epitaxial structure 332.

Moreover, the connecting layer 321 and the transferring material 322 can be configured to cushion to protect the micro light emitting device 330. It should be mentioned that a projecting area of the connecting layer 321 on the substrate 311 is less than a projecting area of the second surface 337 on the substrate 311, hence the connecting layer 321 is contracted under the semiconductor epitaxial structure 332, and the covering layer 340 is also contracted under the semiconductor epitaxial structure 332. When a contracting distance of the covering layer 340 contracted under the semiconductor epitaxial structure 332 is d, the covering layer 340 has a contracting angle θ2, which is on a connecting area between the semiconductor epitaxial structure 332 and the connecting layer 321, and the contracting angle θ2 can be less than or equal to 90 degrees. Hence, the connecting layer 321 is easily squeezed to deform and break in the following process by the contracting angle θ2.

FIG. 10 is a schematic view of the micro light emitting device structure 300 after transferring according to the embodiment in FIG. 7. FIG. 11 is another schematic view of the micro light emitting device structure 300 after transferring according to the embodiment in FIG. 7. In FIGS. 10 and 11, the covering layer 340 is contacted with the transferring material 322, and the connecting layer 321 is removed after transferring.

According to the embodiment of FIG. 11, the covering layer 340 can be further disposed on the second surface 337 of the semiconductor epitaxial structure 332 by the contracting disposition. Further, when the covering layer 340 is disposed on the second surface 337 of the semiconductor epitaxial structure 332, a projecting area of the covering layer 340 on the second surface 337 is A1, and a surface area of the second surface 337 is A2, the following condition can be satisfied: $0.8 A2 \leq A1 \leq A2$. Therefore, a light emitting area of the micro light emitting device 330 can be increased, and the light guiding efficiency can be promoted.

In detail, when the covering layer 340 is disposed on a light emitting surface of the micro light emitting device 330, the covering layer 340 is configured to guide the light. Moreover, the covering layer 340 may not be contracted before transferring, hence the covering layer 340 is merely disposed on the lateral surface 338 of the semiconductor epitaxial structure 332, and the covering layer 340 is configured to isolate, reflect and protect.

It should be mentioned that the micro light emitting device structure 300 according to the embodiments of FIGS. 7 to 11 can be further transferred after transferring, and the transferring number can be determined under the real situation. Furthermore, an area of the covering layer 340, which is configured to isolate a lateral surface to be an insulating layer, is the same as an area of the semiconductor epitaxial structure 332, and the covering layer 340 can be obtained without the yellow-light process. In general, the insulating layer of the conventional art obtained by the yellow-light process is likely to obtain a structure similar to the eave because of the window, and the aforementioned structure is not favorable for the transferring process of the wafer. Therefore, according to the embodiment of FIGS. 7 to 11, the process cost can be reduced, and the micro light emitting device structure 300, which is favorable for the transferring process of the wafer, can be obtained.

Further, all of other structures and dispositions according to the embodiment of FIG. 7 are the same as the structures and the dispositions according to the embodiment of FIG. 1, and will not be described again herein.

Figure 13:
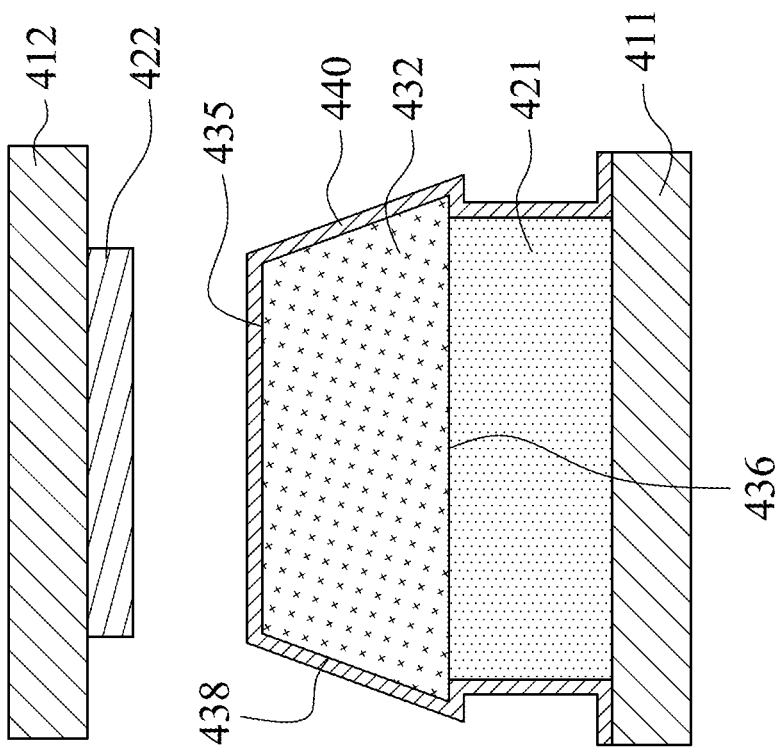
FIG. 13 is a transferring schematic view of the semiconductor epitaxial structure and the covering layer according to the embodiment in FIG. 12.
Figure 12:
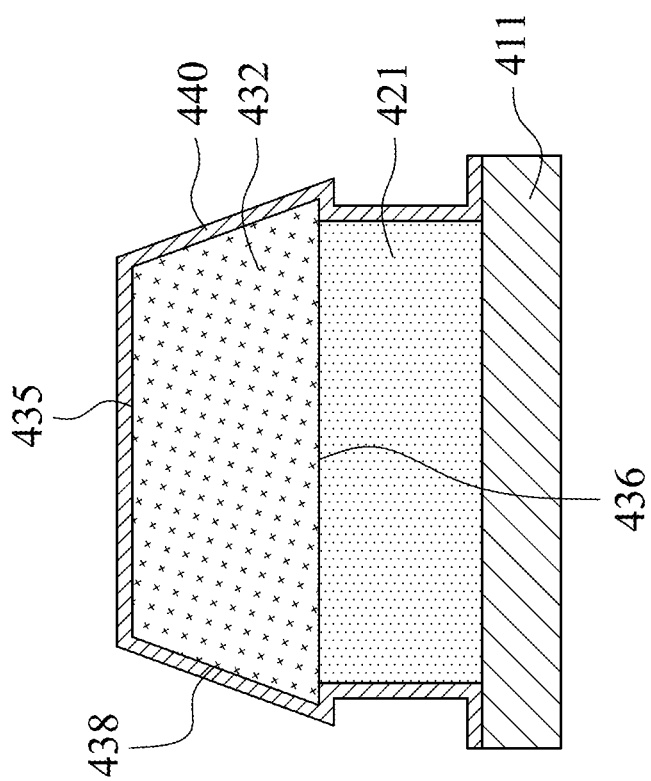
FIG. 12 is an assembling schematic view of a substrate, a connecting layer, a semiconductor epitaxial structure and a covering layer according to another embodiment of the present disclosure.
Figure 15:
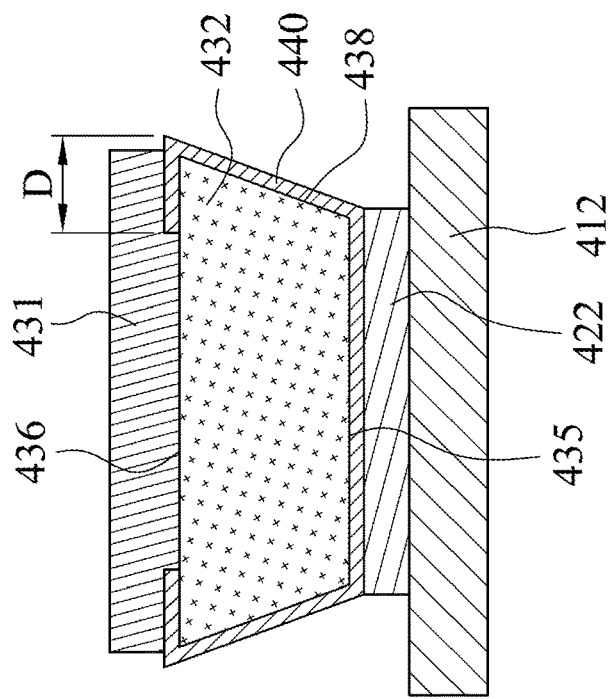
FIG. 15 is another schematic view of disposing the electrode of the micro light emitting device structure after transferring according to the embodiment in FIG. 12.
Figure 14:
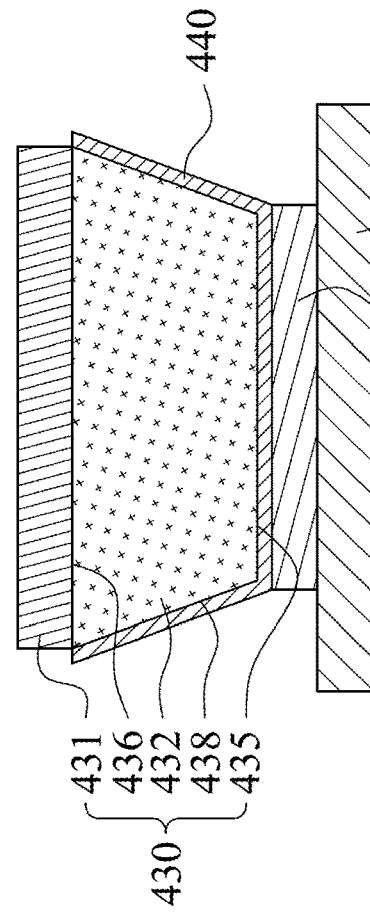
FIG. 14 is a schematic view of disposing an electrode of a micro light emitting device structure after transferring according to the embodiment in FIG. 12.

FIG. 12 is an assembling schematic view of a substrate 411, a connecting layer 421, a semiconductor epitaxial structure 432 and a covering layer 440 according to another embodiment of the present disclosure. FIG. 13 is a transferring schematic view of the semiconductor epitaxial structure 432 and the covering layer 440 according to the embodiment in FIG. 12. FIG. 14 is a schematic view of disposing an electrode 431 of a micro light emitting device structure 400 after transferring according to the embodiment in FIG. 12. FIG. 15 is another schematic view of disposing the electrode 431 of the micro light emitting device structure 400 after transferring according to the embodiment in FIG. 12. In FIGS. 12 to 15, the micro light emitting device structure 400 includes the substrate 411, the connecting layer 421, a micro light emitting device 430 and the covering layer 440.

The micro light emitting device 430 is removably connected to the connecting layer 421, and includes the electrodes and the semiconductor epitaxial structure 432. The covering layer 440 is disposed on an outer surface of the semiconductor epitaxial structure 432 and an outer surface of the connecting layer 421. In detail, the covering layer 440 is disposed on a first surface 435 and a lateral surface 438 of the semiconductor epitaxial structure 432. Therefore, the micro light emitting device structure 400 can be effectively protected during the transferring process. Furthermore, the electrodes can be disposed on the first surface 435 of the semiconductor epitaxial structure 432 and a second surface 436 of the semiconductor epitaxial structure 432 away from the first surface 435, respectively, after transferring. The electrode 431 disposed on the first surface 435 is disposed after the covering layer 440 removed a portion to form an opening, and the electrode 431 can be disposed before transferring or after transferring, but the present disclosure is not limited thereto. In particular, according to the embodiment of FIG. 12, the micro light emitting device 430 can be a vertical micro LED, wherein the electrode 431 and another one electrode (not shown), which have the opposite electrical properties, are disposed on two relative surfaces (that is, the second surface 436 and the first surface 435) of the semiconductor epitaxial structure 432, respectively.

In detail, when the micro light emitting device structure 400 is transferred, a transferring substrate 412 is disposed on the semiconductor epitaxial structure 432, wherein a transferring material 422 is contacted with the covering layer 440 on the first surface 435 of the semiconductor epitaxial structure 432, and the transferring material 422 is disposed between the transferring substrate 412 and the covering layer 440 to connect the transferring substrate 412 and the micro light emitting device 430 of the micro light emitting device structure 400. Then, the micro light emitting device structure 400 is pressed via the transferring substrate 412, the connecting layer 421 is squeezed and deformed, and the connecting layer 421 is broken.

Moreover, both of a Young's modulus of the covering layer 440 and a Young's modulus of the semiconductor epitaxial structure 432 are larger than a Young's modulus of the connecting layer 421.

In FIG. 15, the covering layer 440 can be further disposed on the second surface 436 of the semiconductor epitaxial structure 432, and a disposing distance D of the covering layer 440 is larger than or equal to 0.5 μm, and the disposing distance D is less than or equal to 1 μm. At least one of the electrodes is connected to the covering layer 440. According to the embodiment of FIG. 15, the electrode 431 disposed on the second surface 436 is connected to the covering layer 440. In particular, a disposing area of the electrode 431 can be controlled by controlling the covering layer 440 disposed on the second surface 436 of the semiconductor epitaxial structure 432. Therefore, the enough area, which is configured to accept the electrons, can be provided. Simultaneously, the electrode 431 can be avoided being excessively disposed on the lateral surface 438 of the semiconductor epitaxial structure 432, and the situation of the electrical leakage on the side can be prevented.

Further, all of other structures and dispositions according to the embodiment of FIG. 12 are the same as the structures and the dispositions according to the embodiment of FIG. 1, and will not be described again herein.

Figure 16:
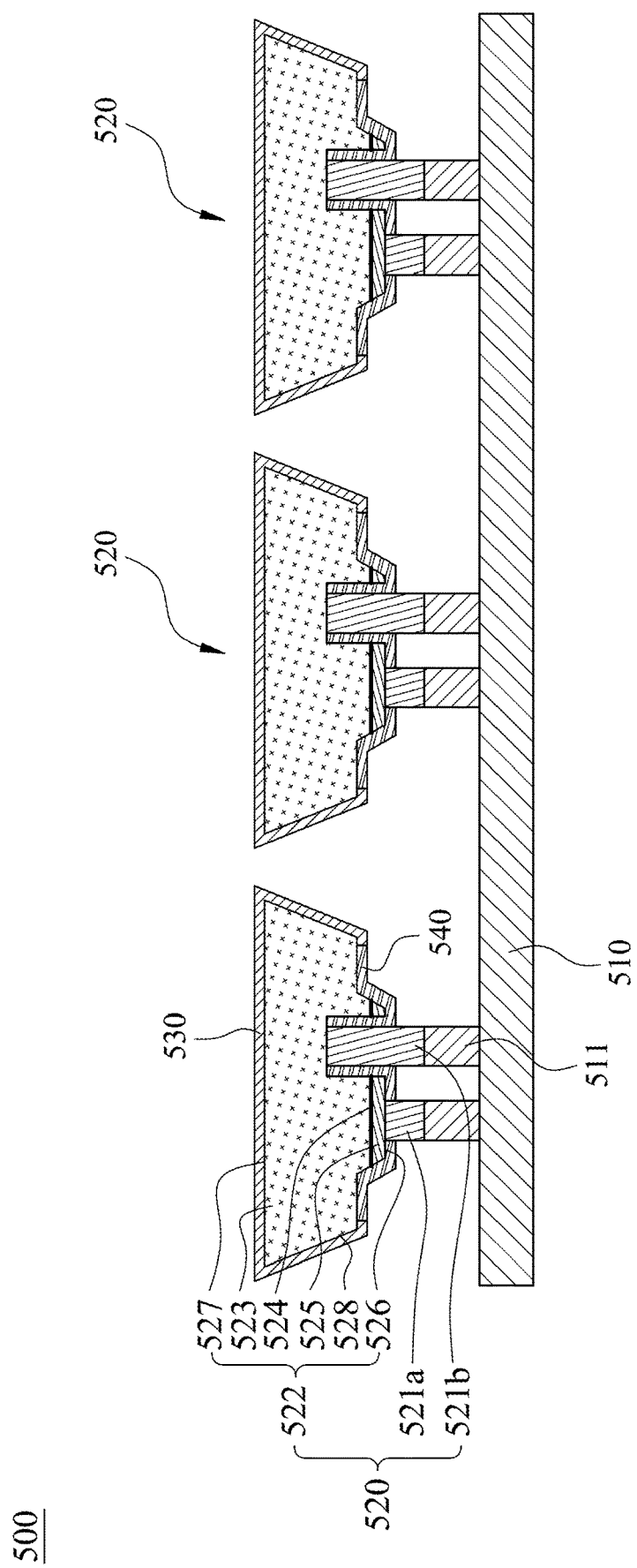
FIG. 16 is a schematic view of a display apparatus according to an embodiment of the present disclosure.

FIG. 16 is a schematic view of a display apparatus 500 according to an embodiment of the present disclosure. In FIG. 16, the display apparatus 500 includes a circuit substrate 510, a plurality of micro light emitting devices 520, a covering layer 530 and an isolation layer 540.

The circuit substrate 510 includes a pad layer 511, and the micro light emitting devices 520 are electrically connected to the circuit substrate 510 via the pad layer 511, wherein a number of the micro light emitting devices 520 can at least three, and the micro light emitting devices 520 can be at least separated into a red micro light emitting device, a green micro light emitting device and a blue micro light emitting device according to the light emitting sources of different colors, but the present disclosure is not limited thereto.

Each of the micro light emitting devices includes two electrodes and a semiconductor epitaxial structure 522, wherein the semiconductor epitaxial structure 522 has an outer surface, and includes a first semiconductor epitaxial layer 523, a light emitting layer 524 and a second semiconductor epitaxial layer 525. Furthermore, the light emitting layer 524 is disposed between the first semiconductor epitaxial layer 523 and the second semiconductor epitaxial layer 525, and the electrodes are disposed on the semiconductor epitaxial structure 522, and electrically connected to the pad layer 511, wherein the electrodes includes a first electrode 521*a* and a second electrode 521*b*, which have the opposite electrical properties, the first electrode 521*a* is electrically connected to the second semiconductor layer 525, and the second electrode 521*b* is electrically connected to the first semiconductor layer 523.

The covering layer 530 is disposed on the outer surface of the semiconductor epitaxial structure 522, the isolation layer 540 is disposed on the outer surface of the semiconductor epitaxial structure 522, and the covering layer 530 is contacted with the isolation layer 540. In particular, the isolation layer 540 is disposed on a first surface 526 of the outer surface of the semiconductor epitaxial structure 522, and the covering layer 530 is disposed on a second surface 527 and a lateral surface 528 of the semiconductor epitaxial structure 522, wherein the second surface 527 is away from the first surface 526 of the semiconductor epitaxial structure 522.

In detail, when the covering layer 530 and the isolation layer 540 are disposed on a light emitting surface of each of the micro light emitting devices 520, the covering layer 530 and the isolation layer 540 are configured to guide the light; when the covering layer 530 and the isolation layer 540 are disposed on the lateral surface 528 of the semiconductor epitaxial structure 522, the covering layer 530 and the isolation layer 540 are configured to isolate and protect.

Figure 17:
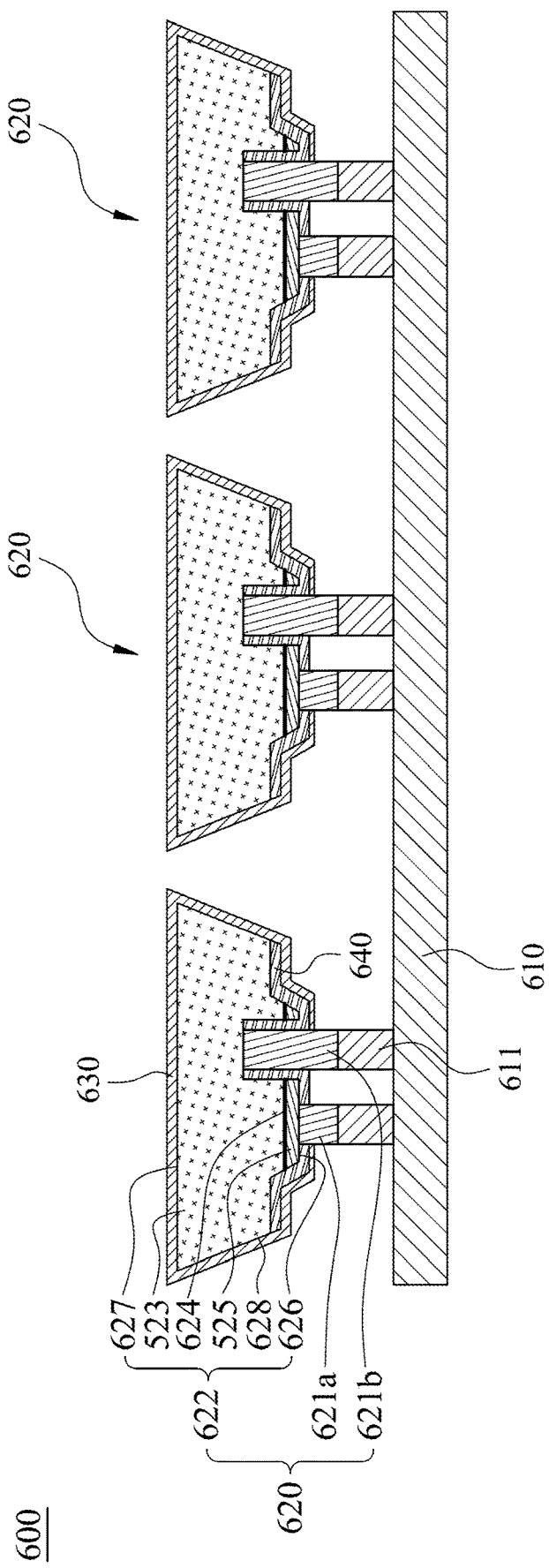
FIG. 17 is a schematic view of a display apparatus according to another embodiment of the present disclosure.
Figure 18:
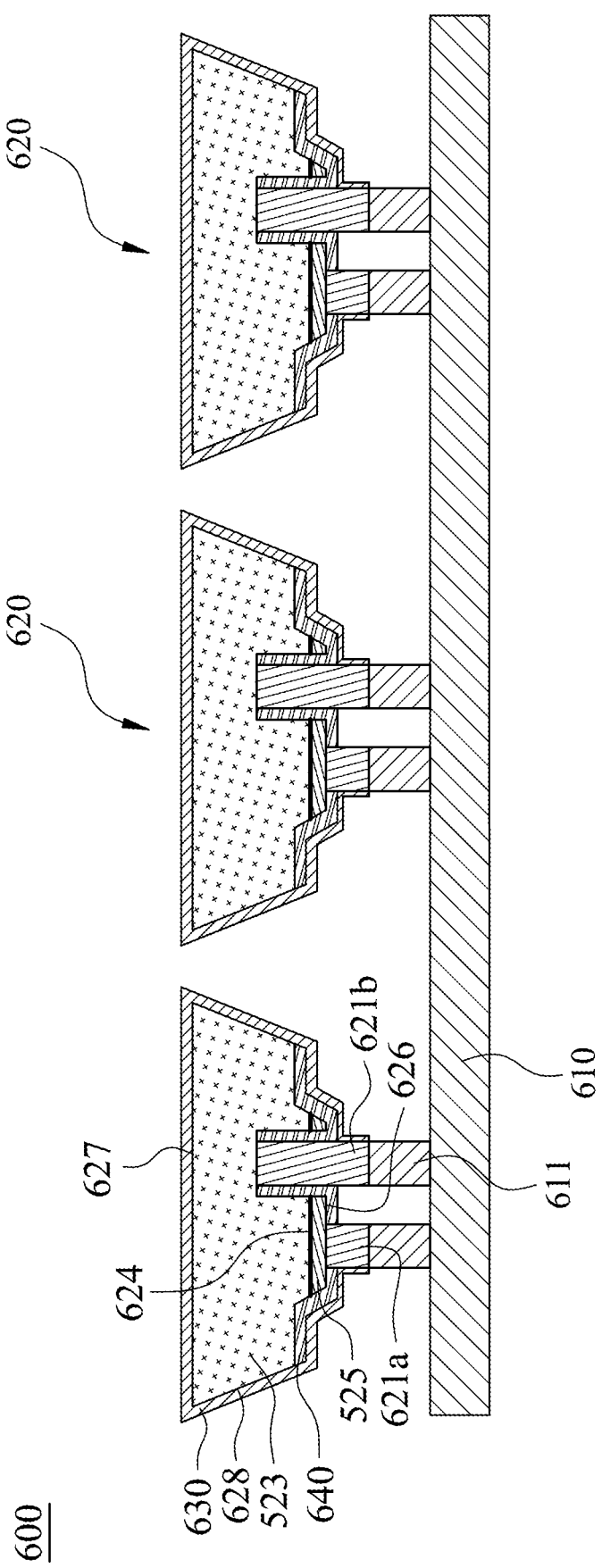
FIG. 18 is another schematic view of the display apparatus according to the embodiment in FIG. 17.

FIG. 17 is a schematic view of a display apparatus 600 according to another embodiment of the present disclosure. FIG. 18 is another schematic view of the display apparatus 600 according to the embodiment in FIG. 17. In FIGS. 17 and 18, the display apparatus 600 includes a circuit substrate 610, a plurality of micro light emitting devices 620, a covering layer 630 and an isolation layer 640, wherein the circuit substrate 610 includes a pad layer 611, and the micro light emitting devices 620 are electrically connected to the circuit substrate 610 via the pad layer 611. The covering layer 630 is disposed on an outer surface of a semiconductor epitaxial structure 622, the isolation layer 640 is disposed on the outer surface of the semiconductor epitaxial structure 622, and the covering layer 630 is contacted with the isolation layer 640, wherein the covering layer 630 is disposed on an outer surface of the isolation layer 640, and is contacted with at least portions of a lateral surface of each of electrodes (that is, a first electrode 621*a* and a second electrode 621*b*). In particular, the isolation layer 640 is disposed on a first surface 626 of the outer surface of the semiconductor epitaxial structure 622, and the covering layer 630 is disposed on a second surface 627 and a lateral surface 628 of the semiconductor epitaxial structure 622, wherein the second surface 627 is away from the first surface 626 of the semiconductor epitaxial structure 622. Moreover, a lateral surface of a light emitting layer 624 is covered via the isolation layer 640 and the covering layer 630. Therefore, the light emitting layer 624 can be entirely protected by the dual protection of the isolation layer 640 and the covering layer 630.

According to the embodiment of FIG. 18, it should be mentioned that the covering layer 630 can be further and entirely disposed on an outer lateral surface of each of the electrodes (that is, the first electrode 621*a* and the second electrode 621*b*). Hence, the electrodes can have the better protection and the higher support during being connected to the pad layer 611, and the electrodes are not influenced by the high pressure and the high temperature.

Further, all of other structures and dispositions according to the embodiments of FIGS. 17 and 18 are the same as the structures and the dispositions according to the embodiment of FIG. 16, and will not be described again herein.

In summary, by the micro light emitting device structure and the display apparatus of the present disclosure, not only can the manufacturing cost be reduced, but the light guiding efficiency can be simultaneously enhanced. Further, the present disclosure is favorable for the compact size of the micro light emitting device structure and the display apparatus.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A micro light emitting device structure, comprising:
a substrate;
a connecting layer connected to the substrate;
a micro light emitting device connected to the connecting layer, and comprising:
a semiconductor epitaxial structure having an outer surface, wherein the outer surface of the semiconductor epitaxial structure comprises a first surface, a second surface closer to the substrate than the first surface and farthest away from the first surface, and a lateral surface between the first surface and the second surface; and two electrodes disposed on the first surface of the outer surface of the semiconductor epitaxial structure, or disposed on the first surface of the outer surface of the semiconductor epitaxial structure and the second surface of the outer surface of the semiconductor epitaxial structure farthest away from the first surface of the outer surface of the semiconductor epitaxial structure, respectively;

a covering layer disposed on the outer surface of the semiconductor epitaxial structure; and an isolation layer disposed on the first surface of the outer surface of the semiconductor epitaxial structure, wherein the isolation layer is disposed between a lateral surface of a light emitting layer of the semiconductor epitaxial structure and the covering layer, wherein the covering layer comprises a first portion disposed on an outer surface of the isolation layer farthest away from the semiconductor epitaxial structure and a second portion directly physically contacted with the lateral surface and the second surface of the outer surface of the semiconductor epitaxial structure, wherein the first portion of the covering layer is disposed directly above the first surface of the outer surface of the semiconductor epitaxial structure, and wherein the covering layer is a single layer structure and disposed on the first surface of the outer surface of the semiconductor epitaxial structure, on the lateral surface of the outer surface of the semiconductor epitaxial structure, and on a portion of the isolation layer.

2. The micro light emitting device structure of claim 1, wherein a Young's modulus of the covering layer is larger than a Young's modulus of the connecting layer.

3. The micro light emitting device structure of claim 1, wherein the covering layer is contacted with the connecting layer.

4. The micro light emitting device structure of claim 1, wherein the covering layer is disposed on the second surface of the semiconductor epitaxial structure, a projecting area of the covering layer on the second surface is A1, a surface area of the second surface is A2, and the following condition is satisfied:

$0.8A2 \leq A1 \leq A2$.

5. The micro light emitting device structure of claim 1, wherein a disposing distance of the covering layer covering the second surface of the outer surface of the semiconductor epitaxial structure is greater than a disposing distance of the covering layer covering the first surface of the outer surface of the semiconductor epitaxial structure.

6. The micro light emitting device structure of claim 1, wherein at least one of the electrodes is connected to the isolation layer.

7. The micro light emitting device structure of claim 1, wherein a Young's modulus of the isolation layer is larger than a Young's modulus of the connecting layer.

8. The micro light emitting device structure of claim 1, wherein the covering layer is contacted with the isolation layer.

9. The micro light emitting device structure of claim 1, wherein a Young's modulus of the covering layer is less than or equal to the Young's modulus of the isolation layer.

10. The micro light emitting device structure of claim 1, wherein a thickness of the covering layer is less than or equal to a thickness of the isolation layer.

11. The micro light emitting device structure of claim 1, wherein a disposing distance of the covering layer covering the outer surface of the isolation layer is less than or equal to 10 μm.

12. The micro light emitting device structure of claim 1, wherein the isolation layer is contacted with the lateral surface of the light emitting layer of the semiconductor epitaxial structure.

13. The micro light emitting device structure of claim 1, wherein a first portion of the first surface of the outer surface of the semiconductor epitaxial structure is covered by the first portion of the covering layer and a second portion of the first surface of the outer surface of the semiconductor epitaxial structure is free from being covered by the first portion of the covering layer.

14. A display apparatus, comprising:
a circuit substrate, comprising a pad layer;
a plurality of micro light emitting devices electrically connected to the circuit substrate via the pad layer, and each of the micro light emitting devices comprising:
a semiconductor epitaxial structure having an outer surface, wherein the outer surface of the semiconductor epitaxial structure comprises a first surface facing the circuit substrate, a second surface farthest away from the first surface, and a lateral surface between the first surface and the second surface; and
two electrodes disposed on the first surface of the outer surface of the semiconductor epitaxial structure facing the circuit substrate, and electrically connected to the pad layer;
a covering layer disposed on the outer surface of the semiconductor epitaxial structure; and
an isolation layer disposed on the first surface of the outer surface of the semiconductor epitaxial structure, wherein the isolation layer is disposed between a lateral surface of a light emitting layer of the semiconductor epitaxial structure and the covering layer,
wherein the covering layer comprises a first portion contacted with the isolation layer and disposed on an outer surface of the isolation layer farthest away from the semiconductor epitaxial structure and a second portion directly physically contacted with the lateral surface and the second surface of the outer surface of the semiconductor epitaxial structure,
wherein the first portion of the covering layer is disposed directly above the first surface of the outer surface of the semiconductor epitaxial structure, and
wherein the covering layer is a single layer structure and disposed on the first surface of the outer surface of the semiconductor epitaxial structure, on the lateral surface of the outer surface of the semiconductor epitaxial structure, and on a portion of the isolation layer.

15. The display apparatus of claim 14, wherein the covering layer is contacted with the electrodes.

16. The micro light emitting device structure of claim 1, wherein the second portion of the covering layer is connected to the first portion of the covering layer.

17. The micro light emitting device structure of claim 1, wherein a portion of the outer surface of the isolation layer is covered by the first portion of the covering layer and other portions of the outer surface of the isolation layer are spaced apart from the covering layer.

18. The display apparatus of claim 15, wherein the covering layer is disposed on a portion of a lateral surface of each of the electrodes.

19. The micro light emitting device structure of claim 1, wherein each of the electrodes comprises a first surface and a second surface farthest away from the first surface, and wherein the first surface of each of the electrodes is contacted with the semiconductor epitaxial structure and the second surface of each of the electrodes is spaced apart from the covering layer.

20. The micro light emitting device structure of claim 19, wherein each of the electrodes further comprises a lateral surface between the first surface and the second surface, and wherein the lateral surface of each of the electrodes has a portion covered by the isolation layer and remaining portions spaced apart from the isolation layer.

* * * * *